United States Patent [19]

Schmitz

[11] Patent Number: 4,904,620
[45] Date of Patent: Feb. 27, 1990

[54] METHOD OF MANUFACTURING A SEMICONDUCTOR DEVICE INCLUDING A TITANIUM DISILICIDE CONTACT

[75] Inventor: Johannes E. J. Schmitz, Eindhoven, Netherlands

[73] Assignee: U.S. Philips Corporation, New York, N.Y.

[21] Appl. No.: 176,916

[22] Filed: Apr. 4, 1988

[30] Foreign Application Priority Data

Apr. 8, 1987 [NL] Netherlands ............... 8700820

[51] Int. Cl.[4] .......................................... H01L 21/285
[52] U.S. Cl. .................................... 437/200; 437/178; 437/188; 437/246; 437/193; 148/DIG. 147
[58] Field of Search ............... 437/193, 200, 192, 245, 437/246, 178, 188, 187; 357/675, 715; 148/DIG. 147

[56] References Cited

U.S. PATENT DOCUMENTS

| | | | |
|---|---|---|---|
| 4,337,476 | 6/1982 | Fraser et al. | 437/193 |
| 4,359,490 | 11/1982 | Lehrer | 427/95 |
| 4,504,521 | 3/1985 | Widmer et al. | 437/245 |
| 4,557,943 | 12/1985 | Rosler et al. | 427/38 |
| 4,568,565 | 2/1986 | Gupta et al. | 437/245 |
| 4,668,530 | 5/1987 | Reif et al. | 437/200 |

FOREIGN PATENT DOCUMENTS 2104728 3/1983 United Kingdom .

OTHER PUBLICATIONS

Ahmad et al., *Thin Solid Films*, 143 (1986), pp. 155–162.
Morgan et al., *J. Vac. Sci. Technol.* B4(3), May/Jun. 1986, pp. 723–731.

Primary Examiner—Brian E. Hearn
Assistant Examiner—T. N. Quach
Attorney, Agent, or Firm—Paul R. Miller

[57] ABSTRACT

The invention relates to a method of manufacturing a semiconductor device, in which a titanium disilicide layer is formed on a substrate by means of a chemical reaction activated by a plasma from the gaseous phase. In a readily reproducible manner, this is achieved in that titanium silicide layers (2,4,6) having an atomic ratio of titanium to silicon of at least about 4:5 and silicon layers (3,5,7) are alternately deposited from the gaseous phase and these layers are homogenized in a heat treatment to a titanium disilicide layer.

9 Claims, 2 Drawing Sheets

4,904,620

METHOD OF MANUFACTURING A SEMICONDUCTOR DEVICE INCLUDING A TITANIUM DISILICIDE CONTACT

BACKGROUND OF THE INVENTION

The invention relates to a method of manufacturing a semiconductor device, in which a titanium disilicide layer is formed on a substrate by means of a chemical reaction activated by plasma from the gaseous phase.

A method of the kind mentioned in the opening paragraph is known from U.S. Pat. No. 4,557,943. In the known method, use is made of a gaseous phase comprising gaseous silane and gaseous titanium tetrachloride, while a titanium disilicide layer is deposited on the substrate.

Examinations which have led to the invention have proved that the composition of the deposited titanium silicide layer can strongly depend upon the ratio of the quantities of the silane and titanium tetrachloride present in the gaseous phase. It has more particularly proved to be extremely difficult to deposit by means of a gas plasma a titanium disilicide layer on a substrate with comparatively small variations around a gaseous phase composition comprising about 1 part of $TiCl_4$ for 8 parts of $SiH_4$, in which event normal titanium disilicide ($TiSi_2$) is deposited, for example, a layer having a composition with about 3 parts of Ti for 4 parts of Si may readily be deposited.

It has also been found that with a gaseous phase comparatively rich in titanium, titanium silicide layers are deposited, which are comparatively rich in titanium, the composition of the deposited layer being only slightly dependent upon the composition of the gaseous phase.

BRIEF DESCRIPTION OF THE INVENTION

The invention has inter alia for its object to provide a method of the kind mentioned in the opening paragraph, in which the composition of the layer to be formed is only slightly dependent upon the composition of the gaseous phase used.

The invention is based inter alia on the recognition of the fact that use can then be made of titanium silicide layers comparatively rich in titanium.

According to the invention, the method mentioned in the opening paragraph is characterized in that titanium silicide layers having an atomic ratio of titanium to silicon of at least about 4 : 5 and silicon layers are alternately deposited on the substrate from the gaseous phase and the titanium silicide layers and the silicon layers are homogenized to a titanium disilicide layer in a subsequent heat treatment.

Thus, in a readily reproducible manner a titanium disilicide layer can be obtained.

Preferably, in a first variation of the method according to the invention, an average value of 1 : 2 is chosen for the ratio of titanium to silicon in the whole of the deposited titanium silicide layers and silicon layers and the subsequent heat treatment is carried out in a nonoxidizing atmosphere.

It is avoided that silicon is extracted from the titanium disilicide layer and it is achieved that this layer remains free from oxide.

Further, in a second variation of the method according to the invention, an average value smaller than 1 : 2 is preferably chosen for the ratio of titanium to silicon in the whole of the deposited titanium silicide layers and silicon layers and the subsequent heat treatment is carried out in an oxidizing atmosphere.

The excess quantity of silicon present in the deposited titanium silicide layers and silicon layers with respect to titanium disilicide is found to be able to diffuse during the heat treatment in an oxidizing atmosphere to the free surface of the forming titanium disilicide layer where the excess quantity of silicon is converted into a silicon oxide layer, which can be used for isolation purposes.

Preferably, the gaseous phase contains during the deposition of the titanium silicide layers titanium tetrachloride and silane in a volume ratio of about 1 : 1. In this range the variation of the composition of the titanium silicide layers upon variation of the gas composition is small and the composition is about Ti/Si=0.9.

The heat treatment can effectively be carried out at 650° C.

Particularly favourable results are obtained with conventional equipment and thickness of the titanium silicide layers and the silicon layers of about 20 nm. The ultimate thickness of the titanium disilicide layers is, for example, 800 nm.

It should be noted that the U.S. Patent describes that an amorphous silicon layer, a titanium disiliced layer and an amorphous silicon layer are successively deposited. In this case, no homogenization of the deposited layers takes place, which is also hardly possible for the silicon layers with the interposed titanium disilicide layers. Therefore, the object was to form not a homogeneous, but a composite layer.

The titanium disilicide layer in the semiconductor device obtained by means of the method according to the invention can have a number of functions. For example, the titanium disilicide layer is particularly suitable to be used for providing conductor tracks due to its favourable electrical properties.

Therefore, in a first embodiment of the method according to the invention, a titanium disilicide layer is formed on a polysilicon layer as a substrate and a conductor pattern is provided in the titanium disilicide layer and the polysilicon layer. With such a construction of conductor tracks in a conductor pattern, dimensions of conductor tracks can be considerably smaller than with polysilicon alone without the RC time constant of the conductor track becoming inadmissibly large.

The titanium disilicide layer may also be used, for example, for the planarization of the surface of the substrate at a stage of manufacturing the semiconductor device by means of the method according to the invention.

Therefore, in a second embodiment of the method according to the invention, as a substrate a silicon oxide layer with openings is used and a titanium disilicide layer having depressions at the area of the openings is formed on the silicon oxide layer and in the openings, whereupon a photoresist layer is provided on the titanium disilicide layer and the photoresist layer is removed except in the depressions in the titanium disilicide layer; subsequently, the titanium disilicide layer is removed with the use of the photoresist layer in the depressions of the titanium disilicide layer as a mask, while finally the photoresist layer is entirely removed while maintaining the titanium disilicide layer in the openings in the silicon oxide layer.

Thus, a practically flat substrate surface is obtained.

BRIEF DESCRIPTION OF THE DRAWINGS

The invention will now be described with reference to the accompanying drawing and a few embodiments.

In the drawing.

DETAILED DESCRIPTION

In the embodiments, during the manufacture of a semiconductor device use is made of a conventional arrangement, in which by means of a chemical reaction activated by a plasma from a gaseous phase a titanium disilicide layer is formed on a substrate.

Figure 1:
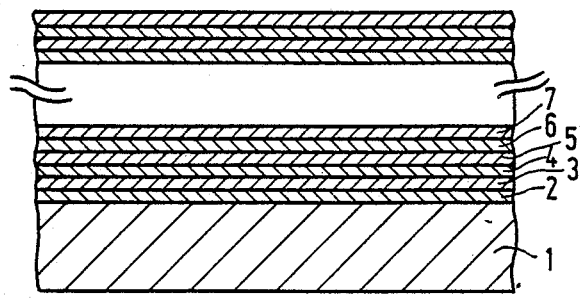
FIG. 1 shows diagrammatically and in sectional view a part of the semiconductor device at a stage of manufacture by of the method according to the invention, In the drawing.
Figure 2A:
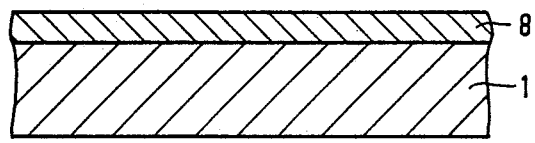
FIG. 2a shows diagrammatically and in sectional view a part of the semiconductor device at a subsequent state of manufacture by means of a first variation of the method according to the invention, In the drawing.

According to the invention, on the substrate 1 (cf. FIG. 1) titanium silicide layers 2,4,6 having an atomic ratio of titanium to silicon of at least about 4 : 5 and silicon layers 3,5,7 are alternately deposited from the gaseous phase and in a subsequent heat treatment the titanium silicide layers 2,4,6 and the silicon layers 3,5,7 are homogenized to a titanium disilicide layer 8 (FIG. 2a).

If for the ratio of titanium to silicon in the whole of the deposited titanium silicide layers 2,4,6 and silicon layers 3,5,7 an average value of 1 : 2 is chosen, the subsequent heat treatment is carried out in a non-oxidizing atmosphere, for example an inert gas, such as argon, and the titanium disilicide layer 8 formed is free from oxide.

Figure 2B:
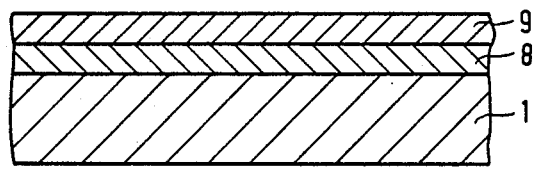
FIG. 2b shows diagrammatically and in sectional view a part of a semiconductor device at a subsequent stage of manufacture by means of a second variation of the method according to the invention, In the drawing.

If for the ratio of titanium to silicon in the whole of the deposited titanium silicide layers 2,4,6 and silicon layers 3,5,7 an average value smaller than 1 : 2 is chosen, the subsequent heat treatment is carried out in an oxidizing atmosphere, for example air and an isolating oxide layer 9 (cf. FIG. 2b) is formed on the titanium disilicide layer 8.

With a volume ratio of titanium tetrachloride to silane in the gaseous phase of 1 : 1, the ratio of titanium to silicon in the titanium silicide layers is about 0.9 and this composition is slightly dependent upon variations in the composition of the gaseous phase.

The thickness of the deposited silicon layers and of the titanium silicide layers is, for example, about 20 nm. For obtaining a titanium disilicide layer of, for example, 800 nm, an even number of about 40 layers is then deposited.

The transition from the deposition of titanium silicide layers to silicon layers and conversely is obtained in a simple manner by interrupting and restoring the supply of titanium tetrachloride.

Layers having a controllable thickness of, for example, 20 nm are readily obtained, the time duration for the deposition is about 1 minute.

The titanium silicide layers and the silicon layers are homogenized in a heat treatment for 30 minutes at 650° C. to a titanium disilicide layer, which composition can be defined by usual Rutherford back scattering (RBS).

Figure 3:
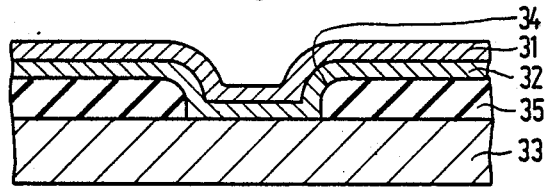
FIGS. 3 and 4 show diagrammatically and in sectional view a part of a semiconductor device at later successive stages of manufacture by means of a first embodiment of the first variation of the method according to the invention.
Figure 4:
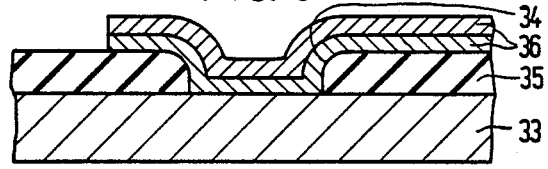

During the heat treatment, a homogeneous titanium disilicide layer is obtained, which has a low electrical resistance. This fact is utilized in the embodiment shown in FIGS. 3 and 4, in which the titanium silicide layer 31 is formed in the manner described above on a polysilicon layer 32 as substrate, while in a usual manner a conductor pattern 36 is provided in the layers 31 and 32. Such a conductor pattern 36 may contact, for example, a silicon body 33 in openings 34 in a silicon dioxide layer 35. The resistivity of the layer 31 is about 15 $\mu\Omega$cm and that of the layer 32 is at least 500 $\mu\Omega$cm.

Figure 5:
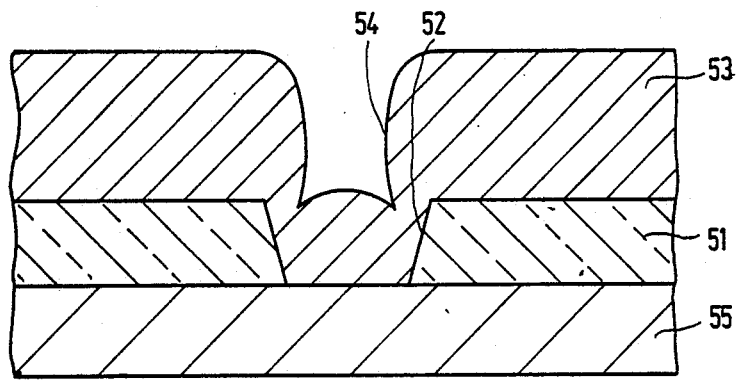
FIGS. 5 to 7 show diagrammatically and in sectional view a part of another semiconductor device at later successive stages of manufacture by means of a second embodiment of the first variation of the method according to the invention.
Figure 6:
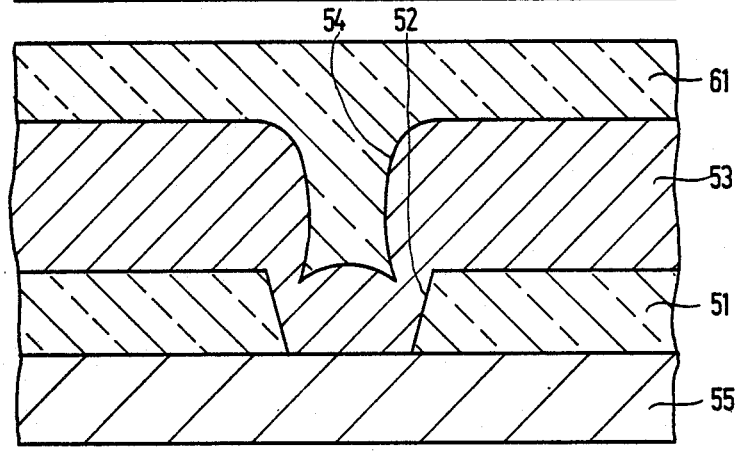
Figure 7:
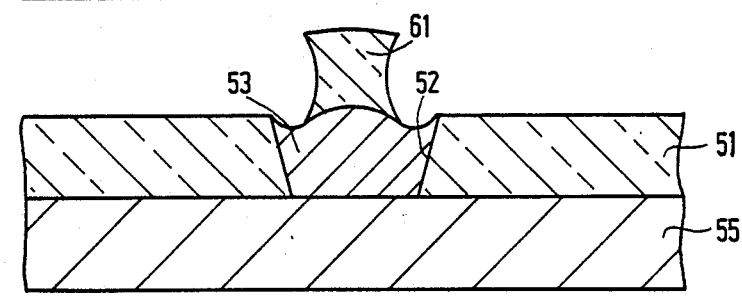

In the embodiment shown in FIGS. 5 to 7, use is made of the favourable etching properties of the titanium disilicide layer for planarization of a semiconductor device at a stage of manufacture.

In this case (cf. FIGS. 5 to 7), a usual silicon oxide layer 51 with openings 52 is utilized as substrate and a titanium disilicide layer 53 is formed in the manner described above on the silicon oxide layer 51 and in the openings 52 with depressions 54 at the area of the openings 52.

The silicon oxide layer 51 may be located on a semiconductor body 55, but may also have a function for, for example, contacting a conductor track pattern.

Subsequently, a usual photoresist layer 61 is provided on the titanium disilicide layer 53, whereupon the photoresist layer 61 is removed in a usual manner except in the depressions 54 in the titanium disilicide layer 53.

Subsequently, the titanium disilicide layer 53 is removed with the use of the photoresist layer 61 in the depressions 54 in the titanium disilicide layer 53 as a mask.

Finally, the photoresist layer is entirely removed while maintaining the titanium disilicide layer 53 in the openings 52 in the silicon oxide layer 51.

Although the invention has been described hereinbefore in details for explanation, it will be appreciated that such details only serve this purpose and that a person skilled in the art can provide modifications without departing from the spirit and the scope of the invention.

What is claimed is:

1. A method of manufacturing a semiconductor device comprising the steps of:
    (a) forming alternate layers of equal numbers of titanium silicide and silicon on a substrate by a CVD technique, said layers of titanium silicide having an atomic ratio of titanium to silicon of about 4:5, wherein said alternate layers are deposited on said substrate alternately from a gaseous phase, and
    (b) subsequently heating said alternate layers of titanium silicide and layers of silicon to a homogenized titanium disilicide layer.

2. A method according to claim 1, wherein each layer of said layers of titanium silicide and each layer of said layers of silicon are formed with a layer thickness of 20 nm.

3. A method according to claim 1 or claim 2, wherein said homogenized layer of titanium disilicide is formed to a thickness of 800 nm.

4. A method according to claim 1 or claim 2, wherein said titanium silicide and silicon are alternatively deposited in an even number of about 40 layers.

5. A method according to claim 1 or claim 2, wherein for the entire deposited titanium silicide layers and silicon layers an average ratio of titanium to silicon of 1:2 is provided, and wherein said step (b) is carried out in a non-oxidizing atmosphere.

6. A method according to claim 1 or claim 2, wherein for the entire deposited titanium silicide layers and silicon layers an average ratio of titanium to silicon smaller than 1:2 is provided, and wherein said step (b) is carried out in an oxidizing atmosphere.

7. A method according to claim 1 or claim 2, wherein said layers of titanium silicide are deposited in said gaseous phase in a volume ratio of about 1:1 of titanium tetrachloride and silane.

8. A method according to claim 1 or claim 2, wherein said homogenized titanium disilicide layer is formed on said substrate, said substrate being polysilicon, and wherein a conductor pattern is provided in said homogenized titanium disilicide layer and said substrate of polysilicon.

9. A method according to claim 1 or claim 2, wherein said substrate is silicon oxide having openings, and wherein said homogenized titanium disilicide layer is formed over said silicon oxide, said openings being filled with depressions of said homogenized titanium disilicide, further comprising the steps of:

(c) forming a photoresist layer on said homogenized titanium disilicide layer, (d) removing said photoresist layer except on said depressions of said homogenized titanium disilicide, (e) removing said homogenized titanium disilicide using said photoresist layer on said depressions as a mask, and (f) entirely removing said photoresist layer to maintain homogenized titanium disilicide in said openings.

* * * * *